United States Patent [19]

Hwan et al.

[11] Patent Number: 4,521,746
[45] Date of Patent: Jun. 4, 1985

[54] MICROWAVE OSCILLATOR WITH TM01δ DIELECTRIC RESONATOR

[75] Inventors: Eugene J. Hwan, San Carlos, Calif.; Darko Kajfez, Oxford, Miss.

[73] Assignee: Harris Corporation, Melbourne, Fla.

[21] Appl. No.: 527,953

[22] Filed: Aug. 31, 1983

[51] Int. Cl.³ .......................... H01P 7/10; H03B 5/18
[52] U.S. Cl. ............................. 331/96; 331/107 DP; 331/117 D; 333/219; 333/232
[58] Field of Search ............. 331/96, 107 DP, 107 C, 331/117 D, 107 SL; 333/224, 226, 232, 219

[56] References Cited

U.S. PATENT DOCUMENTS 4,019,161  4/1977  Kimura et al. ................. 333/219 X
4,271,399  6/1981  Morita ................................ 333/219

OTHER PUBLICATIONS

Saito et al, "A 6 GHz Highly Stabilized GaAs FET Oscillator Using a Dielectric Resonator", Conference: 1979 IEEE MTT-S International Microwave Symposium Digest, Orlando, FL. Apr. 30-May 2, 1979, pp. 197-199.
H. Abe et al, "A Highly-Stabilized Low-Noise GaAs FET Integrated Oscillator With a Dielectric Resonator in the C-Band," *IEEE Trans. Microwave Theory Tech.,* vol. MTT-26, pp. 156-162, Mar. 1978.
J. K. Plourde et al, "Application of Dielectric Resonators in Microwave Components," *IEEE Trans. Microwave Theory Tech.,* vol. MTT-29, pp. 754-770, Aug. 1981.
P. Guillon et al, "TM01p Tubular and Cylindrical Dielectric Resonator Mode,": *IEEE MTT-S Internat. Symp. Digest,* Los Angeles, pp. 163-166, 1981.
Y. Komatsu et al, "A Frequency-Stabilized MIC Oscillator Using a Newly-Developed Dielectric Resonator," *IEEE MTT-S Internat. Symp. Digest,* Los Angeles, pp. 313-315, 1981.
A. P. S. Khanna et al, "Efficient Low-Noise Three Port X-Band FET Oscillator Using Two Dielectric Resonators,: *IEEE MTT-S Internal. Symp. Digest,* Dallas, pp. 277-279, 1982.
O. Ishihara et al, "A Highly Stabilized GaAs FET Oscillator Using a Dielectric Resonator Feedback Circuit in 9-14 GHz," *IEEE Trans. Microwave Theory Tech.,* vol. MTT-28, pp. 817-824, Aug. 1980.
G. D. Alley et al, "An Ultra-Low Noise Microwave Synthesizer," *IEEE Trans. Microwave Theory Tech.,* vol. MTT-27, pp. 969-974, Dec. 1979.

*Primary Examiner*—Siegfried H. Grimm
*Attorney, Agent, or Firm*—Flehr, Hohbach, Test, Albritton & Herbert

[57] ABSTRACT

A microwave oscillator with TM01δ dielectric resonator is disclosed. The oscillator operates with a TM01δ mode as contrasted with prior art techniques of TE01δ mode. This provides for an improved tuning range in excess of 10% of the operating frequency.

9 Claims, 6 Drawing Figures

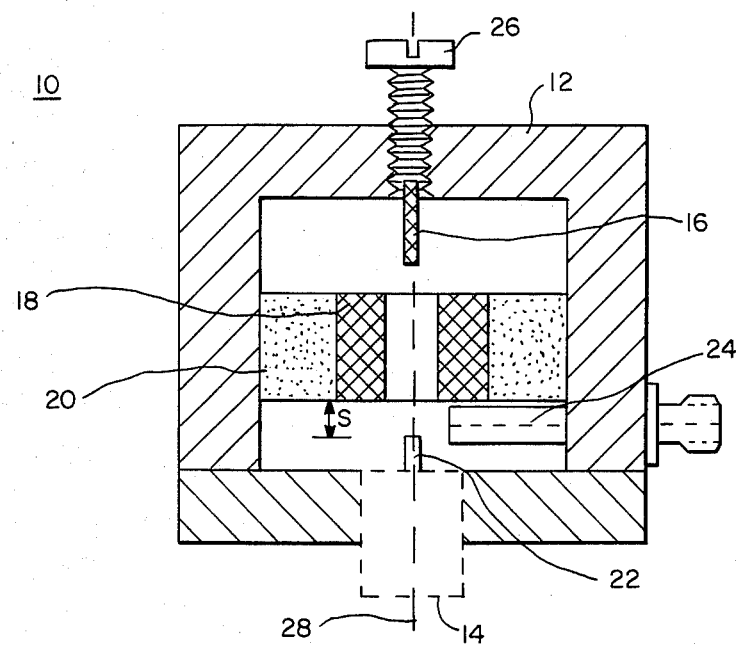
FIG.—1
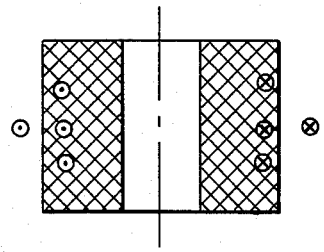
FIG.—2
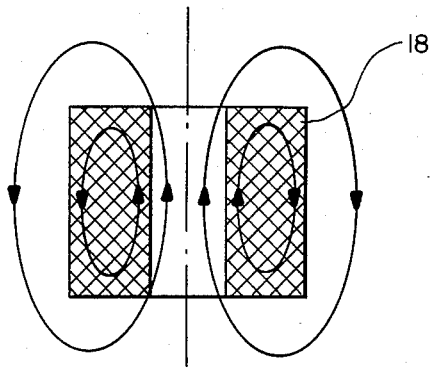
FIG.—3

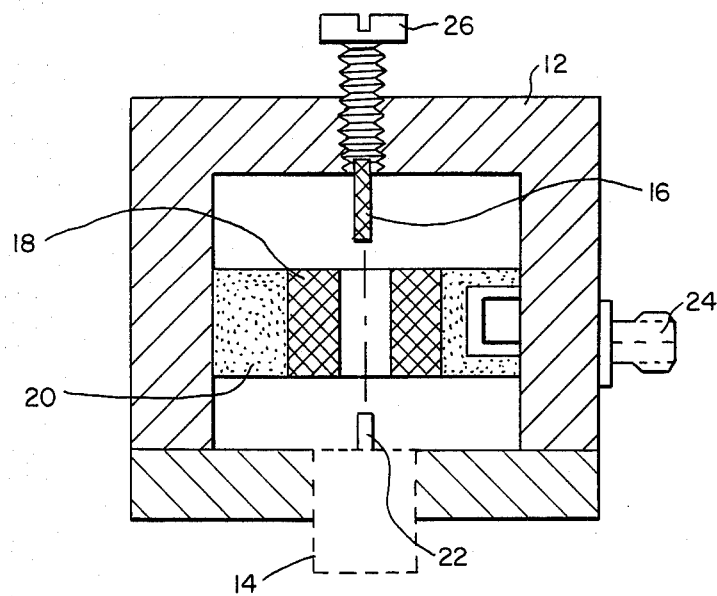
FIG.—4
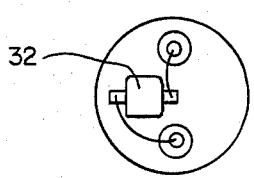
FIG.—5A
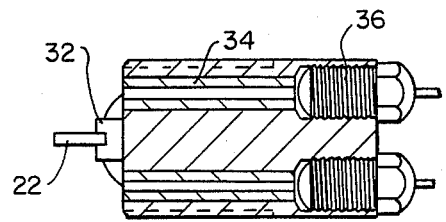
FIG.—5B

MICROWAVE OSCILLATOR WITH TM01δ DIELECTRIC RESONATOR

BACKGROUND OF THE INVENTION

The present invention relates to a microwave oscillator.

Microwave oscillators are devices used for generating waveforms whose frequency range lies between a few hundred and several tens of thousands of megahertz. Typically, microwaves are electromagnetic waves which have a wavelength in the centimeter range. Microwaves occupy a region in the electromagnetic spectrum which is bounded by radio waves on the side of the longer wave lengths and by infrared waves on the side of the shorter wavelengths.

Microwave oscillator techniques, of course, are well known in the art. In particular, microwave oscillators with dielectric resonators are known which operate in a TE01δ mode. Prior art microwave oscillators which utilize the dielectric resonators in the TE01δ mode have a weak electric field at the center of the resonator. Consequently, the tuning of the TE01δ resonator by a dielectric rod at its center is ineffective. For this reason, conventional oscillators with the dielectric resonators are often tuned by means of a metal tuning rod or metal plate. A side effect of introducing the metal object in the vicinity of the dielectric resonator is an appreciable lowering of the Q factor.

Typically, the TE01δ mode is conventionally considered as a desired mode while a TM01δ mode is considered an undesired mode. The problem with such prior art microwave oscillators is that the tuning range is typically no more than one percent of the operating frequency without degrading temperature stability or Q factor. It would therefore be highly desirable to provide an improved microwave oscillator with dielectric resonator which provides an increased tuning range over that of the prior art.

In view of the above background, it is an objective of the present invention to provide an improved microwave oscillator with dielectric resonator.

SUMMARY OF THE INVENTION

The general objective of the invention set forth above is achieved by providing a microwave oscillator with tubular dielectric resonator operating in a TM01δ mode.

In one embodiment of the invention, the improved microwave oscillator includes an active device coupled to a tubular dielectric resonator operating in the TM01δ mode. The active device can be a bipolar microwave transistor, a field-effect microwave transistor, or a Gunn-effect diode or any similar negative resistance device. The tubular dielectric resonator is mechanically tuned with a dielectric tuning rod which is placed coaxially with the resonator. Both the resonator and the tuning rod are made of the same or similar high-permittivity temperature-stable dielectric material. The active device is coupled to the resonator by means of a metal coupling probe which is also placed coaxially with the tubular resonator. An output is provided through another coupling probe, desirably mounted radially, or a loop, desirably mounted perpendicular and radially to the resonator.

In accordance with the foregoing summary, the present invention achieves the objective of providing an improved microwave oscillator with dielectric resonator operating in a TM01δ mode.

Other objects and features of the present invention will become apparent from the following detailed description when taken in conjunction with the accompanying drawings.

BRIEF DESCRIPTION OF THE DRAWINGS

FIG. 1 depicts a cross-sectional diagram of a microwave oscillator with TM01δ dielectric resonator according to the present invention.

FIG. 2 depicts a diagram of an E field of a dielectric resonator operating in a TE01δ mode.

FIG. 3 depicts a diagram of an E field of a TM01δ mode, the mode in which the present invention operates.

FIG. 4 depicts another embodiment of the present invention illustrating an alternative output coupling method.

FIGS. 5A and 5B depict an illustration of an active device assembly for use with the present invention.

DESCRIPTION OF THE DRAWINGS

Referring now to FIG. 1, a cross-sectional diagram of an improved microwave oscillator 10 with TM01δ dielectric resonator according to the present invention is depicted.

The oscillator in FIG. 1 includes a metal housing 12 through which an active device 14 can be coupled. The active device 14 could be a bipolar microwave transistor, a field-effect microwave transistor, a Gunn-effect diode, or any similar negative resistance device.

A tubular dielectric resonator 18 is located within metal housing 12 by means of dielectric spacer 20. Dielectric spacer 20 is typically of low permittivity and is typically Rexolite, RT Duroid 5870M, or other similar material. The tubular dielectric resonator 18 is mechanically tuned with a dielectric tuning rod 16 by means of tuning screw 26.

Both resonator 18 and tuning rod 16 are made of the same or similar high-permittivity temperature-stable dielectric material. Typical dielectric materials which could be used are JFD Resomics (Zr,Sn)TiO4; Transtech D8500; Thomson-CSF (Zr,Sn)TiO4 or other similar materials. The active device 14 is coupled to the resonator 18 by means of a metal coupling probe 22 which is positioned coaxially with the tubular resonator 18.

The output of oscillator 10 is through another coupling probe 24 which is mounted, in a preferred embodiment, radially to resonator 18.

Referring now to FIG. 2, a conventional microwave oscillator mode of operation is depicted. The prior art microwave oscillator utilizes dielectric resonators in the TE01δ mode, which has a weak electric field at the center of the resonator, as indicated in FIG. 2. A problem with such prior art techniques is that even with tubular resonators the tuning of the TE01δ resonator by the dielectric rod at the center is ineffective. For this reason, the conventional oscillators with dielectric resonators are often tuned by means of a metal tuning rod or metal plate, as described previously. One problem of introducting the metal rod in the vicinity of the dielectric resonator is an appreciable lowering of the Q factor.

Referring now to FIG. 3, an E field in which the present invention operates is depicted. In FIG. 3, the dielectric resonator according to the present invention is operated in the TM01δ mode, which is characterized by a strong electrical field along the center of the resonator 18. This makes it possible to tune the resonant frequency of the oscillator 10 of FIG. 1 with the use of a dielectric tuning rod 16, coaxially located with respect to the tubular resonator 18.

The tubular form of the dielectric resonator comes into use principally for the purpose of increasing the separation between the resonant frequencies of the TE01δ mode and the TM01δ mode. The mode TE01δ is conventionally considered as a desired mode and the TM01δ as an undesired mode. When compared with a solid dielectric resonator of the same outer dimensions, the tubular dielectric resonator 18 of FIG. 1 has an almost identical TE01δ resonant frequency, but a considerably higher TM01δ resonant frequency.

As indicated in FIGS. 2 and 3, the present invention reverses the roles of the two modes in the tubular resonator, so that the TM01δ mode becomes desired (FIG. 3) and the TE01δ mode becomes the undesired mode (FIG. 2).

Referring again to FIG. 1, the active device 14 is coupled to the resonator 18 through the metal probe 22 located on the axis 28 of the resonator 18. Such a probe position enables the excitation of the desired TM01δ mode, and it suppresses the undesired TE01δ mode as well as other undesired modes. The same coaxially positioned probe coupling of the active device 14 is useful for the oscillator 10 which utilizes the hollow waveguide TM010 resonant cavity.

The advantage of the coaxially located probe 22 for coupling the active device 14 to the resonator 18 is in the simplicity of the adjustment of the amount of coupling. This adjustment is achieved by changing the distance S, as indicated in FIG. 1, from the tip of the probe 22 to the resonator 18. Moreover, the advantage of this probe coupling according the present invention is in the possibility of mounting the active device 14 directly on a metal housing, without a need for using a microstrip transmission line between the resonator 18 and the active device 14. The probe can be a prong of a diode package in the case of two terminal devices or one of the leads of a transistor or FET bent to the appropriate position.

Referring now to FIG. 4, another embodiment of the present invention is depicted which illustrates an alternative output coupling method. In FIG. 4, the output coupling loop 24 is positioned slightly differently than that as illustrated in FIG. 1, although mounted generally radially to resonator 18. Other output couplings are of course possible than that illustrated in FIG. 4. The output could be mounted at different locations provided that sufficient coupling is provided.

Referring now to FIGS. 5A and 5B, an active device assembly for use with the present invention is illustrated. In this particular application, the active device 32, shown in FIG. 5A, is a bipolar microwave transistor. The coupling probe 22 is formed by simply bending the base lead 90°, as shown in FIG. 5B. The power supply for the transistor 22 is provided via the feedthrough capacitor 36 and the microwave absorber 34.

The mechanical tuning of the oscillation frequency is accomplished by means of a dielectric tuning rod 16 made of the same, or similar, high-permittivity material as the resonator 18 itself. This tuning mechanism provides a smooth tuning because of its non-contacting principle of operation. The amount of tuning may be controlled by the selection of the diameter of the tuning rod 16. A smaller diameter is used when fine tuning is needed over a narrow range of frequencies, while a larger diameter provides the desired tuning over a wider range of frequencies. In a preferred embodiment, the achievable tuning range according the present invention is approximately 6900–7600 MHz, a loaded Q factor is 1760 and an unloaded Q factor is 2235. It can be seen that the tuning range is approximately 10% of the operating frequency or, stated otherwise, that the tuning range is approximately ±5% of the average operating frequency.

The fact that both the tubular dielectric resonator and the tuning rod are made of the same, or similar, high-permittivity temperature-compensated materials improves the temperature coefficient of the oscillator frequency over the entire tuning range. Depending on materials used and actual form and shape of the housing and tuning screw, temperature compensation may be needed which could be achieved by using similar high-permittivity material with a temperature coefficient different from the resonator material. This property makes a considerable improvement in comparison with conventional oscillators where the tuning was accomplished by inserting metal tuning objects into the vicinity of the dielectric resonators. For this reason, the conventional oscillators with dielectric resonators usually require a trade-off between the tuning range and the frequency stability.

What is claimed is:

1. A microwave oscillator comprising
   a tubular dielectric resonator operating in a TM01δ mode and having a resonant oscillation frequency,
   an adjustable dielectric tuning rod located coaxially to said resonator for tuning to the resonant frequency of said resonator, said resonator and said tuning rod having similar dielectric properties, and
   a metal housing for supporting said resonator and said tuning rod.

2. An oscillator as in claim 1 including an active device coaxially coupled to said resonator.

3. An oscillator as in claim 2 including an active device coupling probe for coupling said active device to said resonator, including means for adjusting the amount of coupling.

4. An oscillator as in claim 3 wherein said active device is a bipolar microwave transistor.

5. An oscillator as in claim 3 wherein said active device is a field-effect microwave transistor.

6. An oscillator as in claim 3 wherein said active device is a Gunn-effect diode.

7. An oscillator as in claim 3 including an output coupling probe radially coupled to said resonator.

8. An oscillator as in claim 7 including a low-permittivity dielectric spacer for spacing said resonator from said housing.

9. A microwave oscillator comprising
   tubular dielectric resonator means operating in a TM01δ mode and dielectric tuning rod means located coaxially to said resonator for tuning to the resonant frequency of said resonator, wherein said resonator means and said tuning rod means have similar high-permittivity temperature compensated dielectric properties.

* * * * *